United States Patent
Buchwalter et al.

(10) Patent No.: US 6,261,951 B1
(45) Date of Patent: Jul. 17, 2001

(54) PLASMA TREATMENT TO ENHANCE INORGANIC DIELECTRIC ADHESION TO COPPER

(75) Inventors: Leena P. Buchwalter, Hopewell Junction; Barbara Luther, Cold Spring; Paul D. Agnello, Wappingers Falls; John P. Hummel, Milbrook; Terence Lawrence Kane, Wappingers Falls; Dirk Karl Manger; Paul Stephen McLaughlin, both of Poughkeepsie, all of NY (US); Anthony Kendall Stamper, Williston, VT (US); Yun Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/472,346

(22) Filed: Dec. 27, 1999

Related U.S. Application Data

(63) Continuation-in-part of application No. 09/225,530, filed on Jan. 4, 1999.

(51) Int. Cl.⁷ .................................................. H01L 21/4763
(52) U.S. Cl. .................... 438/644; 438/687; 438/694; 438/695; 438/710; 438/715; 438/720; 438/643; 438/653; 438/654; 438/658; 438/660; 438/680
(58) Field of Search ................................... 438/687, 694, 438/695, 710, 715, 720, 643, 644, 653, 654, 658, 660, 680

(56) References Cited

U.S. PATENT DOCUMENTS

| | | |
|---|---|---|
| 4,477,311 | 10/1984 | Mimura et al. . |
| 5,273,920 | 12/1993 | Kwasnick et al. . |
| 5,391,517 | 2/1995 | Gelatos et al. . |
| 5,447,887 | 9/1995 | Filipiak et al. . |
| 5,592,024 | 1/1997 | Aoyama . |
| 5,624,868 | 4/1997 | Iyer . |
| 5,659,201 | 8/1997 | Wollesen . |
| 5,818,071 | 10/1998 | Loboda et al. . |
| 6,008,124 | * 12/1999 | Sekiguchi et al. .................... 438/653 |

FOREIGN PATENT DOCUMENTS

| | | |
|---|---|---|
| 5-144811 | 6/1993 | (JP) . |
| 11-87353 | 3/1999 | (JP) . |

OTHER PUBLICATIONS

Sylvain C. Audisio, et al., "Silicon Nitride Coatings on Copper", J. Electrochem. Soc.: Electrochemical Science and Technology, vol. 119, No. 4, pp. 408–411 (Apr. 1972).

IBM Technical Disclosure Bulletin, "Low Stress Dielectric Coatings for Copper Parts", vol. 31, No. 12, pp. 317–318 (May 1989).

N. Korner, et al., "Hydrogen Plasma Chemical Cleaning of Metallic Substrates and Silicon Wafers", Surface and Coatings Technology, vol. 76–77, pp. 731–737 (1995).

S. Hymes, et al., "Surface Cleaning of Copper by Thermal and Plasma Treatment in Reducing and Inert Ambients", J. Vac. Sci. Technol. B 16 (3), pp. 1107–1109 (May/Jun. 1998).

Yasushi Swada, et al., "The Reduction of Copper Oxide Thin Films with Hydrogen Plasma Generated by an Atmospheric–Pressure Glow Discharge", J. Phys. D. Appl. Phys., 28 (1996), pp. 2539–2544.

* cited by examiner

Primary Examiner—John F. Niebling
Assistant Examiner—David A Zarneke
(74) Attorney, Agent, or Firm—Scully, Scott, Murphy & Presser; Howard J. Walter, Esq.

(57) ABSTRACT

The present invention utilizes a reducing plasma treatment step to enhance the adhesion of a subsequently deposited inorganic barrier film to a copper wire or via present in a semiconductor interconnect structure such as a dual damascene structure. Interconnect structure comprising a material layer of Cu, Si and O, as essential elements, is formed between said copper wire or via and the inorganic barrier film.

19 Claims, 1 Drawing Sheet

US 6,261,951 B1

PLASMA TREATMENT TO ENHANCE INORGANIC DIELECTRIC ADHESION TO COPPER

RELATED APPLICATIONS

This application is a continuation-in-part application of U.S. application Ser. No. 09/225,530, filed Jan. 4, 1999.

FIELD OF THE INVENTION

The present invention relates to novel interconnect semiconductor structures and, in particular to a method for improving the adhesion of an inorganic barrier film such as $Si_3N_4$ to the copper lines or vias of such interconnect structures. The improved adhesion is obtained in the present invention by treating the copper (Cu) lines or vias in a reducing plasma atmosphere under conditions such that a new material layer comprising Cu, Si, O and optionally at least one of C, H, N and F is formed and thereafter forming the inorganic barrier film on the new material layer. The term "interconnect structure" is used broadly herein to include any semiconductor structure which contains copper interconnect metallurgies. Thus, the present invention is applicable for use in damascene structures (single and dual), memory cell capacitors and other wiring applications for logic, memory and input/output applications.

BACKGROUND OF THE INVENTION

In the semiconductor industry, aluminum and aluminum alloys have been used as the traditional interconnect metallurgies. While aluminum-based metallurgies have been the material of choice for use as metal interconnects over the past years, concern now exists as to whether aluminum will meet the demands required as circuit density and speeds for semiconductor devices increase. Because of these growing concerns, other materials have been investigated as possible replacements for aluminum-based metallurgies.

One highly advantageous material now being considered as a potential replacement for aluminum metallurgies is copper. This is because copper exhibits a lower susceptibility to electromigration failure as compared to aluminum as well as a lower resistivity.

Despite these advantages, copper readily diffuses into the surrounding dielectric material during subsequent processing steps. To inhibit the diffusion of copper, copper interconnects are often times capped with a protective barrier layer. One method of capping involves the use of a conductive barrier layer of tantalum or titanium, in pure or alloy form, along the sidewalls and bottom of the copper interconnection. To cap the upper surface of the copper interconnection, a dielectric material such as silicon nitride, $Si_3N_4$, is typically employed.

Due to the need for low temperature processing after copper deposition, the silicon nitride layer is deposited at temperatures below 450° C. Accordingly, silicon nitride deposition is typically performed using plasma enhanced chemical vapor deposition (PECVD) or high density plasma chemical vapor deposition (HDPCVD) wherein the deposition temperature generally ranges from about 200° to about 500° C.

PECVD and HDPCVD silicon nitride have been used for many other applications in semiconductor device manufacturing. However, in using a silicon nitride cap for copper interconnects, conventional PECVD or HDPCVD silicon nitride creates reliability problems. In particular, silicon nitride films deposited using conventional PECVD or HDPCVD processes generally exhibit poor adhesion to the copper surface. For instance, some nitride films delaminate and form blisters over patterned copper lines, particularly during subsequent dielectric depositions, metallization, and chemical-mechanical polishing.

These results are indicative of how the silicon nitride film might adhere to the copper in actual fabrication processes. After being deposited onto copper metallurgy, additional insulating layers generally will be deposited over the silicon nitride film. However, subsequent deposition of insulating layers onto the nitride film will produce stress which can cause the silicon nitride film to peel from the copper surface. This delamination results in several catastrophic failure mechanisms including: lifting intermetal dielectrics, lifting copper lines, and copper diffusion from uncapped copper lines. Such results are generally seen in dual damascene processing wherein delamination of the silicon nitride RIE stop layer generally occurs during copper chemical-mechanical polishing (CMP).

Prior art nitride to copper adhesion requires siliciding the copper surface by reacting it with silicon. This prior art method has two drawbacks: increases the copper sheet resistance due to silicon reacting with copper and diffusion therein; and marginal nitride to copper adhesion due to incomplete or partial copper silicide formation.

In view of the drawbacks mentioned with prior art copper interconnect structures, there is a continued need to develop a new process of facilitating the adhesion of an inorganic barrier film to copper surfaces which are present on interconnect semiconductor structures.

SUMMARY OF THE INVENTION

One object of the present invention is to provide a method of improving the adhesion of an inorganic deposited barrier film to a copper surface of an interconnect structure.

Another object of the present invention is to provide a method whereby the deposited inorganic barrier film does not delaminate from a copper surface of an interconnect structure during subsequent interconnect processing steps.

A further object of the present invention is to provide a method which can be used in dual damascene processing to improve the adhesion of a $Si_3$ $N_4$ etch stop layer to copper wiring or copper vias.

A yet further object of the present invention is to provide an interconnect structure in which a material layer comprising Cu, Si, O and optionally at least one of C, H, N and F is formed between the copper lines and vias and the inorganic barrier film.

These and other objects and advantages can be achieved in the present invention by utilizing a method which includes a step of exposing a layer of copper in an interconnect semiconductor structure to a reducing plasma prior to forming an inorganic barrier film on the copper interconnect structure. The reducing plasma treatment is conducted under conditions such that a new material layer is formed on the surface of the Cu lines or vias. The new material layer which comprises Cu, Si, O and optionally at least one of C, H, N and F aids in improving the adhesion of an inorganic barrier film to a Cu line or via. The new material layer formed by the plasma treatment step of the present invention has a thickness that is less than 10 nm.

Specifically, the method of the present invention, which improves the adhesion of an inorganic deposited barrier film on copper surfaces of an interconnect structure, comprises the steps of:

(a) exposing an interconnect semiconductor structure containing at least a layer of copper to a reducing plasma under conditions such that a new material layer comprising Cu. Si, O and optionally at least one of C, H, N and F is formed on said layer of copper; and (b) forming an inorganic barrier film on said new material layer.

In accordance with the method of the present invention, the exposure step, step (a), is carried out in a plasma comprising at least one non-oxidizing gas selected from the group consisting of $H_2$, $N_2$, $NH_3$, noble gases such as He, Ne, Ar, Kr and Xe, and mixtures thereof. It is noted that oxidizing ambients are excluded from the present invention since the may cause the copper present in the interconnect structure to oxidize and weaken the nitride at the copper interface.

In accordance with another aspect of the present invention, novel interconnect structures are provided. The novel interconnect structures of the present invention comprise at least one copper line or via; a material layer comprising Cu, Si, O and optionally at least one of C, H, N and F formed on said at least one copper line or via; and an inorganic barrier film formed on said material layer.

A highly preferred interconnect structure of the present invention is one wherein the material layer is formed between copper lines or vias and a $Si_3N_4$ inorganic barrier film; $Si_3N_4$ and Cu usually do not have good adhesion due to poor chemical bonding between the same. In this embodiment, the material layer contains Cu, Si, O and N. The presence of this material layer between the Cu metal and $Si_3N_4$ layer greatly improves the adhesion, i.e. chemical bonding, of these two unreacted materials.

Suitable interconnect structures that are contemplated in the present invention include, but are not limited to: memory cell capacitors including plate capacitors, crown capacitors, stack capacitors and other like capacitors; damascene structures including single and dual; multiple wiring levels containing a plurality of vias and metal lines; and other like interconnect structures.

DETAILED DESCRIPTION OF THE INVENTION

Figure 1:
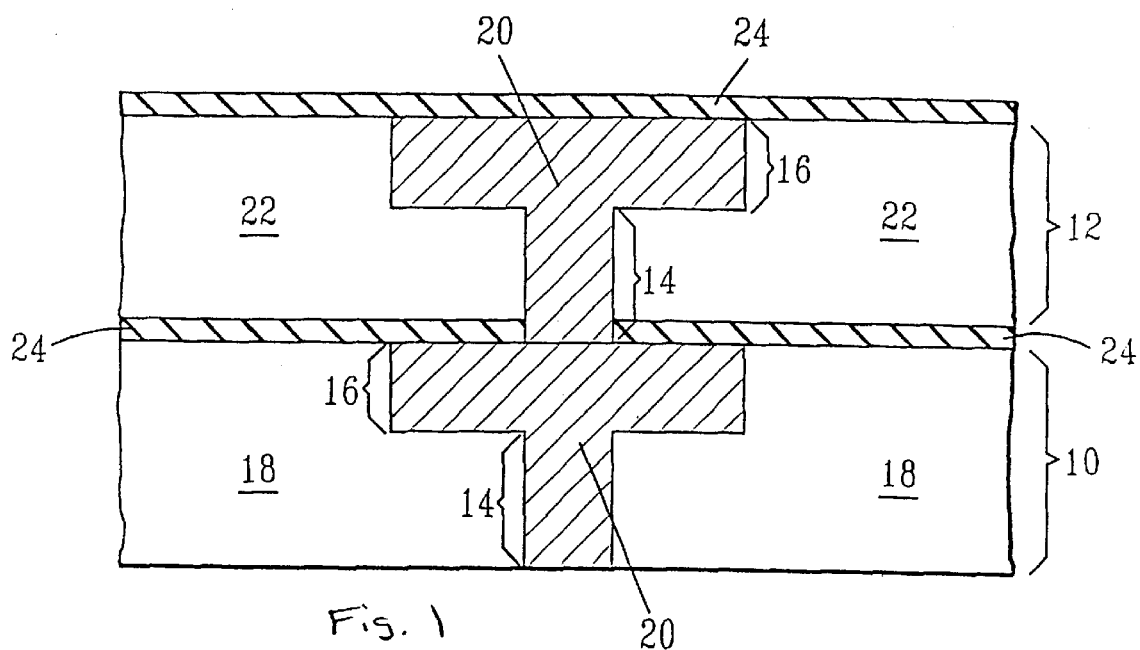
FIG. 1 is a cross-sectional view of a typically dual damascene structure which can be employed in the present invention and thus subjected to the plasma exposure step prior to deposition of the inorganic barrier layer.

The present invention, which relates to a method of improving the adhesion of an inorganic deposited barrier film on copper surfaces present in interconnect semiconductor structures and to novel interconnect structures containing a material layer comprising Cu, Si, O and optionally at least one of C, H, N and F, will now be described in greater detail by referring to the drawings which accompany this specification. It is emphasized that while the present invention illustrates only a dual damascene structure, it is nevertheless applicable for all interconnect semiconductor structures which contain copper metallurgy and use an inorganic deposited barrier film such as SiC or $Si_3N_4$ as a protective barrier or as an etch stop layer.

Referring to FIG. 1 of the present application, that figure shows a typical dual damascene structure which can be subjected to the method of the present invention. Specifically, the dual damascene structure comprises a lower interconnect level 10 and an upper interconnect level 12. Each level includes a via region 14 and a metal line or wiring region 16. Lower interconnect level 10 includes dielectric 18 having an opening or trench therein that is filled with copper 20. On top of lower interconnect level 10 is an upper interconnect level 12 which includes dielectric 22 having a trench region exposing the copper wiring of the lower interconnect level. The trench region of upper interconnect level 12 is filled with copper 20. Between each interconnect level is an inorganic barrier layer or film 24 which serves as a RIE stop layer, a protective barrier layer or both.

The dual damascene structure shown in FIG. 1 is fabricated utilizing conventional damascene processing steps well known to those skilled in the art except that before forming barrier layer 24, the interconnect structure is exposed to the method of the present invention which will be described in greater detail hereinbelow.

Dielectric layers 18 and 22 may be the same or different insulative inorganic or organic material. Suitable dielectrics include, but are not limited to: $SiO_2$, fluorinated $SiO_2$, $Si_3N_4$, polyimides, diamond, diamond-like carbon, silicon polymers, paralyene polymers, fluorinated diamond-like carbon and other like dielectric compounds. Of these dielectric materials, it is preferred that layers 18 and 22 be composed of $SiO$,. The dielectric layers may be doped or undoped. When doped, the dopant may be boron, fluorine, phosphorus, deutrium, silicon, Ge or another like dopant.

Barrier layer 24 is an inorganic material which serves as a RIE stop layer for the vias or, when present as the outermost layer of the structure, as a protective barrier layer. Suitable materials for barrier layer 24 include, but are not limited to: $Si_3N_4$, SiC, hydrogenated $Si_3N_4$ and hydrogenated SiC. Of these materials, it is preferred to use the hydrogenated forms of $Si_3N_4$ or SiC in the present invention as the barrier layer. An optional RIE stop layer may also be inserted between metal lines 16 and vias 14 (this embodiment is not shown in the drawing).

Barrier layer 24 is formed utilizing conventional vapor deposition techniques including, but not limited to: chemical vapor deposition, low pressure chemical vapor deposition, high pressure chemical vapor deposition, high density plasma chemical vapor deposition, plasma enhanced chemical vapor deposition and other like vapor deposition techniques. Of these deposition techniques, plasma enhanced chemical vapor deposition (PECVD) and high density plasma chemical vapor deposition (HDPCVD) are preferred means for depositing the barrier layer.

Figure 2:
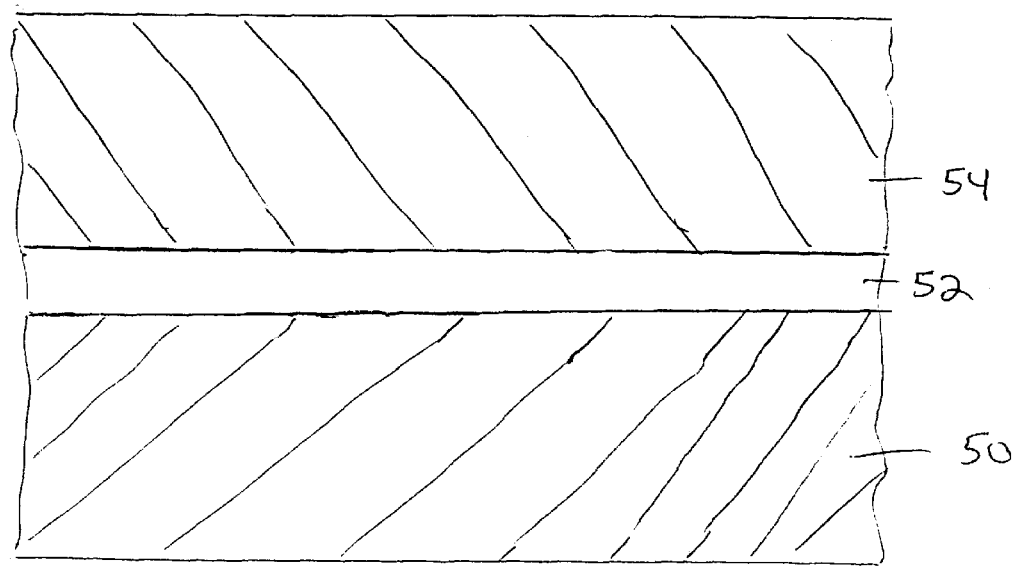
FIG. 2 is a cross-sectional view representing a TEM (transmission electron micrograph) of an interconnect structure of the present invention.

It is again emphasized that the dual damascene structure shown in FIG. 1 as well as any of the other contemplated copper interconnect structures are fabricated using techniques well known to those skilled in the art. Since such techniques are well known and are not critical for understanding the present invention, a detailed discussion of the same is not given herein. The only difference in fabricating the interconnect structure of the present invention and prior art interconnect structures is that prior to depositing inorganic barrier layer or film 24, the copper interconnect structure is subjected to a reducing plasma under the conditions defined hereinbelow. These conditions are sufficient in forming a new material layer between the copper and the inorganic barrier film. For simplicity, the new material layer is not shown in FIG. 1 however it is shown in FIG. 2.

Specifically, the reducing plasma employed in the present invention is any plasma ambient which is non-oxidizing, i.e.

it contains no oxygen atom. Suitable reducing plasmas that can be employed in the present invention include, but are not limited to: $H_2$, $N_2$, $NH_3$ and noble gases. Combinations of two or more of these reducing plasmas such as $N_2$ and $H_2$ are also contemplated herein. Of these reducing plasmas, $H_2$ and $NH_3$ are highly preferred in the present invention.

The reducing plasma exposure step of the present invention is carried out in a conventional plasma deposition apparatus that is capable of generating a plasma gas. Specifically, the exposure step of the present invention is carried out at a temperature of from about 20° to about 600° C. for a time period of from about 1 to about 3600 seconds. Higher exposure times greater than 3600 seconds are also contemplated herein. More preferably, the exposure step of the present invention is carried out at a temperature of from about 360° to about 400° C. for a time period of from about 5 to about 30 seconds. Preferably, heating is carried out in the presence of the reducing plasma.

Moreover, the exposure step of the present invention is conducted at a pressure of from about 1 mTorr to about 20 Torr, a power of from about 50 to about 10,000 watts, and a gas flow rate of from about 1 to about 10,000 sccm. The exact conditions are dependent on the type of deposition process utilized in forming the barrier layer. For example, when high density plasma chemical vapor deposition (HDPCVD) is employed, the exposure step of the present invention is carried out at a pressure of from about 3 to about 6 mTorr, a power of from about 1500 to about 3000 watts, and a gas flow rate of from about 10 to about 50 sccm. On the other hand, when plasma enhanced chemical vapor (PECVD) is to be used, the exposure step of the present invention is carried out at a pressure of from about 2 to about 8 Torr, a power of from about 150 to about 400 watts and a gas flow rate of from about 100 to about 2000 sccm.

As stated supra, the above conditions are sufficient for forming a material layer comprising Cu, Si, O, as essential elements, and optionally at least one of C, H, N and F on the surface of the copper layer prior to deposition of the inorganic barrier layer. FIG. 2 is a drawing representing a TEM of an interconnect structure produced by the method of the present invention. The interconnect structure of FIG. 2 comprises Cu layer 50, material layer 52 and inorganic barrier layer or film 54. Although the drawing depicts a uniform, continuously thick material layer, it should be noted that material layer 52 may have a variable thickness.

The new material layer formed using the method of the present invention is a substantially thin layer which has a thickness of less than 10 nm. More preferably, the thickness of the material layer formed in the present invention is from about 1 to about 5 nm. The thickness of the new material layer formed on the copper layer may be uniform or more preferably a various thickness within the above mentioned range is formed. It should be noted that this new material layer is a continuous layer which aids in improving the adhesion of the inorganic barrier layer to the copper layer.

It is noted that immediately after the exposure step and without breaking the vacuum, the inorganic barrier layer is formed thereon utilizing any of the above mentioned deposition techniques. The method of the present invention, particularly the reducing plasma exposure step, provides a copper interconnect structure wherein the inorganic barrier layer has improved adhesion to the copper wire or via with no increase in resistance than heretofore obtained with prior art processes. Thus, since the adhesion is improved utilizing the method of the present invention, the copper interconnect structure thus formed does not exhibit any delamination problems that are normally encountered by prior art interconnect structures during subsequent processing steps such as chemical-mechanical polishing. Moreover, the interconnect structures produced using the method of the present invention exhibit little or no increase in their resistance.

The following example is given to illustrate the scope of the present invention. Because this example is given for illustrative purposes only the invention embodied therein should not be limited thereto.

EXAMPLE

A series of experiments were performed on 200 mm Si wafers containing copper lines damascened into $SiO_2$ in order to demonstrate the improved adhesion between an inorganic vapor deposition barrier layer and copper wiring which was obtained utilizing the method of the present invention. Specifically, dual damascene structures were prepared utilizing standard damascene processing conditions except that prior to depositing $Si_3N_4$ onto the copper wire of the dual damascene structures, the surfaces were treated utilizing different techniques including no treatment (CE1); treatment in an oxidizing plasma gas ambient (CE2); or treatment in a reducing plasma in accordance with the method of the present invention. After treatment, $Si_3N_4$ deposition, intermetal deposition and dual damascene copper wire/via fabrication each structure was optically examined for delamination. The results of these experiments are summarized in Table 1 below wherein substantially little or no delamination is reported as good, i.e. the adhesion was improved, and the term "poor" denotes substantially no adhesion. It was also observed that the copper surfaces became more reflective as the nitride adhesion improved.

The above results clearly illustrate that improved adhesion of $Si_3N_4$ barrier layer to copper can be obtained by utilizing the reducing plasma exposure step of the present invention. In comparative examples (CE1 and CE2) adhesion was poor and delamination of the $Si_3N_4$ deposited film was observed.

TABLE 1

| PreSi$_3$N$_4$ treatment | Pressure | rf power (W) | electrodes | Temperature (° C.) | Si$_3$N$_4$ adhesion as deposited | Si$_3$N$_4$ adhesion post-CMP | 434 nm reflectivity |
|---|---|---|---|---|---|---|---|
| None (CE1) | — | — | — | — | poor | poor | 0.50 |
| PECVD NH$_3$ | 5 Torr | 300 | 1 cm parallel plate | 250 | good | marginal to good | 0.58 |
| PECVD NH$_3$ | 5 Torr | 300 | 1 cm parallel plate | 400 | good | marginal to good | 0.58 |
| PECVD N$_2$ | 5 Torr | 300 | 1 cm parallel plate | 250 | good | poor | not measured |
| PECVD N$_2$O + N$_2$ | 5 Torr | 300 | 1 cm parallel | 250 | poor | poor | not measured |

TABLE 1-continued

| PreSi$_3$N$_4$ treatment | Pressure | rf power (W) | electrodes | Temperature (° C.) | Si$_3$N$_4$ adhesion as deposited | Si$_3$N$_4$ adhesion post-CMP | 434 nm reflectivity |
|---|---|---|---|---|---|---|---|
| (1:1) (CE2) HDPCVD N$_2$ + H$_2$ | 5 mTorr | 2000 | plate inductively coupled | 375 | good | good | 0.55 |
| HDPCVD H$_2$ | 5 mTorr | 2000 | inductively coupled | 375 | good | good | 0.63 |
| HDPCVD N$_2$ | 5 mTorr | 2000 | inductively coupled | 375 | good | good | 0.59 |
| HDPCVD NH$_3$ | 5 mTorr | 2000 | inductively coupled | 375 | good | poor | 0.53 |

While this invention has been particularly shown and described with respect to preferred embodiments thereof, it will be understood by those skilled in the art that the foregoing and other changes in form and details may be made without departing from the spirit and scope of the present invention. It is therefore intended that the present invention not be limited to the exact forms described and illustrated, but fall within the scope of the appended claims.

Having thus described our invention what we claim as new and desire to secure by the Letters Patent is:

1. A method of facilitating the adhesion of an inorganic barrier film formed on a copper interconnect structure, said method comprising the steps of:

(a) exposing an interconnect semiconductor structure containing at least a layer of copper to a reducing plasma under conditions such that a material layer comprising Cu, Si and O is formed on the layer of copper; and (b) forming an inorganic barrier film on said material layer.

2. The method of claim 1 wherein said exposure step is carried out in a non-oxidizing plasma ambient selected from the group consisting of H$_2$, N$_2$, NH$_3$, noble gases and mixtures thereof.

3. The method of claim 2 wherein said non-oxidizing plasma ambient is H$_2$.

4. The method of claim 2 wherein said non-oxidizing plasma ambient is NH$_3$.

5. The method of claim 1 wherein said exposure step is carried out at a temperature of from about 20° to about 600° C. for a time period of from about 1 to about 3600 seconds or higher.

6. The method of claim 5 wherein said exposure step is carried out at a temperature of from about 360° to about 400° C. for a time period of from about 5 to about 30 seconds.

7. The method of claim 1 wherein said exposure step is conducted at a pressure of from about 1 mTorr to about 20 Torr, a power of from about 50 to about 10,000 watts, and a gas flow rate of from about 1 to about 10,000 sccm.

8. The method of claim 1 wherein said exposure step is carried out by high density plasma chemical vapor deposition at a pressure of from about 3 to about 6 mTorr, a power of from about 1500 to about 3000 watts, and a gas flow rate of from about 10 to about 50 sccm.

9. The method of claim 1 wherein said exposure step is carried out by plasma enhanced chemical vapor deposition at a pressure of from about 2 to about 8 Torr, a power of from about 150 to 400 watts and a gas flow rate of from about 100 to about 2000 sccm.

10. The method of claim 1 wherein said copper interconnect structure is a capacitor structure, a damascene structure or multiple wiring levels containing a plurality of vias and metal lines.

11. The method of claim 10 wherein said copper interconnect structure is a single or dual damascene structure containing copper lines and vias.

12. The method of claim 1 wherein said inorganic barrier film is formed in-situ utilizing a deposition process selected from the group consisting of chemical vapor deposition, low pressure chemical vapor deposition, plasma enhanced chemical vapor deposition and high density plasma chemical vapor deposition.

13. The method of claim 12 wherein said inorganic barrier film is formed in-situ by plasma enhanced chemical vapor deposition or high density plasma chemical vapor deposition.

14. The method of claim 1 wherein said inorganic barrier film is composed of Si$_3$N$_4$, SiC, hydrogenated Si$_3$N$_4$ or hydrogenated SiC.

15. The method of claim 14 wherein said inorganic barrier film is hydrogenated Si$_3$N$_4$ or hydrogenated SiC.

16. The method of claim 1 wherein said interconnect structure includes a dielectric material selected from the group consisting of SiO$_2$, fluorinated SiO$_2$, Si$_3$N$_4$, polyimides, diamond, diamond-like carbon, silicon polymers, paralyene polymers and fluorinated diamond-like carbon.

17. The method of claim 16 wherein said dielectric material is SiO$_2$.

18. The method of claim 1 wherein said layer of copper is formed inside a trench.

19. The method of claim 1 wherein said material layer further includes at least one of C, H, N and F.

* * * * *